United States Patent
Altunkilic et al.

(10) Patent No.: US 10,014,266 B2
(45) Date of Patent: Jul. 3, 2018

(54) MONOLITHIC MICROWAVE INTEGRATED CIRCUIT (MMIC) AND METHOD FOR FORMING SUCH MMIC HAVING RAPID THERMAL ANNEALING COMPENSATION ELEMENTS

(71) Applicant: Raytheon Company, Waltham, MA (US)

(72) Inventors: Fikret Altunkilic, North Andover, MA (US); Adrian D. Williams, Methuen, MA (US); Christopher J. MacDonald, Medford, MA (US); Kamal Tabatabaie Alavi, Sharon, MA (US)

(73) Assignee: Raytheon Company, Waltham, MA (US)

( * ) Notice: Subject to any disclaimer, the term of this patent is extended or adjusted under 35 U.S.C. 154(b) by 39 days.

(21) Appl. No.: 15/219,327

(22) Filed: Jul. 26, 2016

(65) Prior Publication Data
US 2018/0033744 A1 Feb. 1, 2018

(51) Int. Cl.
*H01L 21/26* (2006.01)
*H01L 23/64* (2006.01)
(Continued)

(52) U.S. Cl.
CPC .......... *H01L 23/647* (2013.01); *H01L 21/324* (2013.01); *H01L 21/768* (2013.01); *H01L 23/585* (2013.01); *H01L 2924/1423* (2013.01)

(58) Field of Classification Search
CPC . H01L 21/2686; H01L 21/268; H01L 21/324; H01L 27/0211; H01L 27/1285;
(Continued)

(56) References Cited

U.S. PATENT DOCUMENTS 6,414,387 B1 *  7/2002  Hara ...................... H01L 23/66
                                                        257/691
7,701,034 B2   4/2010  Chuang et al.
(Continued)

OTHER PUBLICATIONS

Yaoguang Wei, Jiang Hu, Frank Liu, Sachin S. Sapatnekar, Physical Design Techniques for Optimizing RTA-induced Variations, Department of Electrical and Computer Engineering, University of Minnesota, Minneapolis, MN, USA, Department of Electrical and Computer Engineering, Texas A&M Univeristy, College Station, TX, USA, IBM Austin Research Lab, Austin, TX, USA, 2007, pp. 1-6 (6 pages).
AZOM, Titanium Alloys—Physical Properties, AZO Materials, (10 pages).
P.J. Timas & Y. Lee, Pattern Effects in Thermal Processing, Mattson Technology, Jul. 13, 2011, 32 pages.
(Continued)

*Primary Examiner* — Kevin M Picardat
(74) *Attorney, Agent, or Firm* — Daly, Crowley, Mofford & Durkee, LLP

(57) ABSTRACT

A method and structure, the structure having a substrate, an active device in an active device semiconductor region; of the substrate, a microwave transmission line, on the substrate, electrically connected to the active device, and microwave energy absorbing "dummy" fill elements on the substrate. The method includes providing a structure having a substrate, an active device region on a surface of the structure, an ohmic contact material on the active device region, and a plurality of "dummy" fill elements on the surface to provide uniform heating of the substrate during a rapid thermal anneal process, the ohmic contact material and the "dummy" fill elements having the same radiant energy reflectivity. The rapid thermal anneal processing forms an ohmic contact between an ohmic contact material and the active device region and simultaneously converts the "dummy" fill elements into microwave lossy "dummy" fill elements.

14 Claims, 11 Drawing Sheets

(51) Int. Cl.
   *H01L 23/58* (2006.01)
   *H01L 21/768* (2006.01)
   *H01L 21/324* (2006.01)

(58) Field of Classification Search
   CPC .......... H01L 27/14698; H01L 27/3223; H01L 21/26526; H01L 21/428
   USPC ....................................................... 438/535
   See application file for complete search history.

(56) References Cited

U.S. PATENT DOCUMENTS

| | | | |
|---|---|---|---|
| 7,745,909 | B2 | 6/2010 | Anderson et al. |
| 8,928,110 | B2 | 1/2015 | Lien et al. |
| 2004/0026794 | A1* | 2/2004 | Tao .......................... H01L 23/50 257/778 |
| 2007/0221957 | A1 | 9/2007 | Kitajima et al. |
| 2007/0228416 | A1 | 10/2007 | Chen et al. |
| 2007/0287200 | A1 | 12/2007 | Anderson et al. |
| 2008/0203540 | A1 | 8/2008 | Anderson et al. |
| 2008/0214020 | A1* | 9/2008 | Ito ..................... H01L 21/67115 438/795 |
| 2011/0156149 | A1 | 6/2011 | Wang et al. |
| 2011/0169098 | A1* | 7/2011 | Morimoto ....... H01L 21/823828 257/369 |
| 2013/0221474 | A1* | 8/2013 | Ohno ................ H01L 27/14634 257/466 |
| 2014/0203288 | A1 | 7/2014 | Hsiung |
| 2015/0186584 | A1 | 7/2015 | Aenuganti et al. |
| 2015/0279692 | A1* | 10/2015 | Greene ................ H01L 21/324 438/585 |

OTHER PUBLICATIONS

Jeff Hebb, Thermal Performance Challenges for Rapid Thermal Processing, 11th IEEE International Conference on Advanced Thermal Processing of Semiconductors—RTP2003, Jan. 2003, 12 pages.
R. Beneyton, A. Colin, H. Bono, F. Cacho, M. Bidaud, B. Dumont, P. Morin, K. Barla, Origin of Local Temperature Variation During Spike Anneal and Millisecond Anneal, 16th IEEE International Conference on Advanced Thermal Processing of Semiconductors—RTP2008, Jul. 2008, 11 pages.
Peter Vandenabeele, Karen Maex, Temperature non-uniformities during rapid thermal processing of patterned wafers, SPIE vol. 1189 Rapid Isothermal Processing, 1989, 15 pages.
R. Illgen, S. Flachowsky, T. Herrmann, T. Feudel, D. Thron, B. Bayha, W. Klix, M. Horstmann, R. Stenzel, A Comparative Study of Non-melt Laser Spike Annealing and Flash Lamp Annealing in Terms of Transistor Performance and Pattern Effects on SOI-CMOSFETs for the 32 nm Node and Below, IEEE, 2009, pp. 157-160, 4 pages.
S.C. Lin, S.F. Liu, F.L. Chen, Using genetic algorithm to optimize the dummy filling problem of the flash lamp anneal process in semiconductor manufacturing, Springer Science+Business Media, LLC, Jul. 9, 2000, pp. 775-785, 11 pages.
Notification of Transmittal of The International Search Report and The Written Opinion of the International Searching Authority, or the Declaration, PCT/US2017/042345, Nov. 2, 2017, 1 page.
International Search Report, PCT/US2017/042345, Nov. 2, 2017, 5 pages.
Written Opinion of the International Searching Authority, PCT/US2017/042345, Nov. 2, 2017, 8 pages.

* cited by examiner

MONOLITHIC MICROWAVE INTEGRATED CIRCUIT (MMIC) AND METHOD FOR FORMING SUCH MMIC HAVING RAPID THERMAL ANNEALING COMPENSATION ELEMENTS

TECHNICAL FIELD

This disclosure relates generally to rapid thermal anneal (RTA), uniform rapid thermal anneal compensation elements, and more particularly to Monolithic Integrated Circuits having RTA uniform compensation elements.

BACKGROUND AND SUMMARY

As is known in the art, rapid thermal anneal (RTA) apparatus has been used in the semiconductor industry for many years. Early, the apparatus was used in processing silicon wafers during an implantation activation phase of the fabrication. One such arrangement uses apparatus wherein a silicon wafer is positioned between a set of horizontally disposed upper heating lamps and a set of horizontally disposed lower heating lamps.

In more recent times, RTA apparatus has been used to alloy metals such as when forming ohmic contacts to the active devices, for example, source and drain contacts for Field Effect Transistors (FETs) formed on compound semiconductor materials, such as GaN or GaAs. In some applications, a susceptor, such as a graphite susceptor, absorbs heat received by radiation from the upper and lower sets of halogen heating lamps. The susceptor absorbs the radiation then transfers its heat to the wafer enclosed within the susceptor by both conduction and re-radiation to heat the wafer and thereby alloy the metals with the semiconductor material and produce the ohmic contacts.

As is also known in the art, various techniques have been used to create a more uniform heating of a silicon wafer with a planar silicon based process such as Bulk CMOS, SOI processes to produce digital/RF type circuitry, see for example: "Temperature non-uniformities during rapid thermal processing of patterned wafers" by Peter Vandenabeele and Karen Maex, Interunmiversity Micro-electronic Center (IMEC) Kapeldreef 75, 3030 Leuven, Belgium; "Thermal Performance Challenges for Rapid Thermal Processing", by Jeff Hebb, Axcelis Techmologies, Inc. Beverly, Mass., IIth IEEE International Conference on Advanced Processing of Semiconductors-RTP2003; "Origin of Local Temperature Variation During Spike Anneal and Millisecond Anneal" by R. Beneyton, A. Colin, H. Bono, F. Cacho, M. Didaud, B. Dumont, P. Morin, K. Barla, 16th IEEE International Conference on Advanced Thermal Processing of Semiconductore-RTP2008; and "Pattern effects in Thermal Processing", by P. J. Timans and Y. Lee, Mattson Technology. For example, one technique used is to provide RTA uniform compensation elements, such as arrays of physically spaced "dummy" fill elements; stand-alone heat absorbing pads or elements used to absorb some of the heat and thereby provide a greater heating uniformity across the wafer.

SUMMARY

In accordance with the present invention, a structure is provided, comprising: a substrate; an active device in an active device semiconductor region of the substrate; a microwave transmission line, on the substrate, having an electrical conductor electrically connected to the active device; and a plurality of microwave energy absorbing "dummy" fill elements on the substrate.

In one embodiment, the "dummy" fill elements have a resistivity at least an order of magnitude greater than the resistivity of the electrical conductor.

In one embodiment, the microwave energy absorbing "dummy" fill elements and a strip conductor of the microwave transmission line are on a surface of the substrate.

In one embodiment, a portion of the microwave energy absorbing "dummy" fill elements is disposed under a passive component.

In one embodiment, the passive component is strip conductor of the microwave transmission line.

In one embodiment, a method is provided for forming ohmic contacts, comprising: providing a structure comprising: a substrate; an active device region of a portion of a surface of the substrate; an ohmic contact material on the active device region; and a plurality of "dummy" fill elements on the surface of the substrate to provide uniform heating of the substrate during anneal processing of the substrate; and subjecting the surface of the substrate to the anneal processing from a source of the radiant energy to form an ohmic contact between an ohmic contact material and the active device region and simultaneously convert the plurality of "dummy" fill elements into microwave lossy "dummy" fill elements.

In one embodiment, the plurality of "dummy" fill provide uniform heating of the substrate during the anneal processing of the substrate.

In one embodiment, the dummy" fill elements have a resistivity at least an order of magnitude greater than the resistivity of the electrical conductor after the anneal processing.

In one embodiment, the provided dummy" fill elements have a reflectivity to radiant energy within ten percent of the reflectivity of electrical contacts of ohmic contact material, prior to the anneal processing.

With such method and structure both the ohmic contact alloying problem and microwave coupling problem are solved simultaneously by using microwave energy lossy "dummy" fill elements having substantially the same radiation reflectivity as material used to form ohmic contact with the semiconductor active device region.

More particularly, the inventors have recognized that with microwave circuitry, for example, monolithic microwave integrated circuitry (MMIC) using microwave transmission lines to interconnect active devices, such as transistors, such as field effect transistors, to other active and passive devices through microwave transmission lines, electromagnetic coupling may occur between the microwave transmission lines and the "dummy" fill elements, thereby requiring a proper, sufficiently large spacing between the plurality of "dummy" fill elements (DF) and the microwave transmission line. The inventors have further recognized that this space required for isolation can be reduced by having the elements used in the plurality of"dummy" fill elements comprise material that both: matches the optical reflectivity and absorption characteristics of the metal structures to be alloyed over the wavelength range of the incident radiation from the RTA apparatus to thereby obtain proper ohmic metal-semiconductor alloying; and have microwave lossy material (material that absorbs microwave energy) decrease electrical coupling (or increase attenuation) between "dummy" fill elements to "dummy" fill elements and decrease the spacing between the "dummy" fill elements and the microwave transmission lines thereby freeing up additional surface area of the MMIC chip for additional circuitry.

More particularly, during the rapid thermal anneal (RTA) of ohmic metal contacts to AlGaN semiconductor material, the heating profile is non-uniform due to the fact that heat transfer is radiative (infrared) and the ohmic metal features are typically not uniformly distributed across an integrated circuit, but residing only in the active device regions of the circuit. This leads to non-uniform alloying across the wafer. Further, establishing an RTA process that works well for one circuit design inevitably leads to variation when applied to another design with differing metal topology because the optical properties (absorption, reflection and transmission) of the wafer with respect to the incident infrared energy from the RTA system can change significantly. As noted above, one solution to this problem is to add "dummy" fill elements in empty spaces (and, in one embodiment, under passive components) of the MMIC. Adding such structures, one can tailor the optical profile of any given wafer, allowing one to significantly reduce heating variation across a wafer and from design to design when utilizing a RTA process. By tailoring optical profile, DC/RF/visual yield, gate leakage current, and morphology of MMIC can be improved and the cost of MMIC/mm$^2$ can be reduced. However, as noted above, adding such structures to a MMIC design may induce unwanted RF performance degradation due to electromagnetic coupling losses between the circuit elements and the "dummy" fill elements. RF performance degradation can take the form of reduced gain, efficiency, output power, noise figure, etc.

Thus, as noted above, the inventors introduce microwave lossy, material into the "dummy" fill elements which both: improves RTA heating uniformity across any given wafer, and minimizes any deleterious impact to RF performance. Microwave lossy material is used for the "dummy" fill elements to mitigate any undesired electromagnetic coupling from the circuit elements into the "dummy" fill elements, which mitigates any circuit performance impact due to the introduction of the fill elements. Thus, as noted above, here microwave lossy metal "dummy" fill elements are used to simultaneously solve the heating uniformity problem without inducing RF performance degradation in the circuit thereby enabling the area required for the "dummy" fill elements to be closer to the microwave circuit coupled to the FET band freeing up additional surface area on the chip for additional circuitry and/or reducing the cost of MMIC/mm$^2$ even more.

Thus, the disclosure provides on-wafer compensation elements ("dummy" fill elements) for improved heating uniformity during rapid thermal anneal (RTA) processing, with such elements having electrical properties that allow for improved compaction when integrated with radio frequency (RF) monolithic microwave integrated circuit (MMIC) technology.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
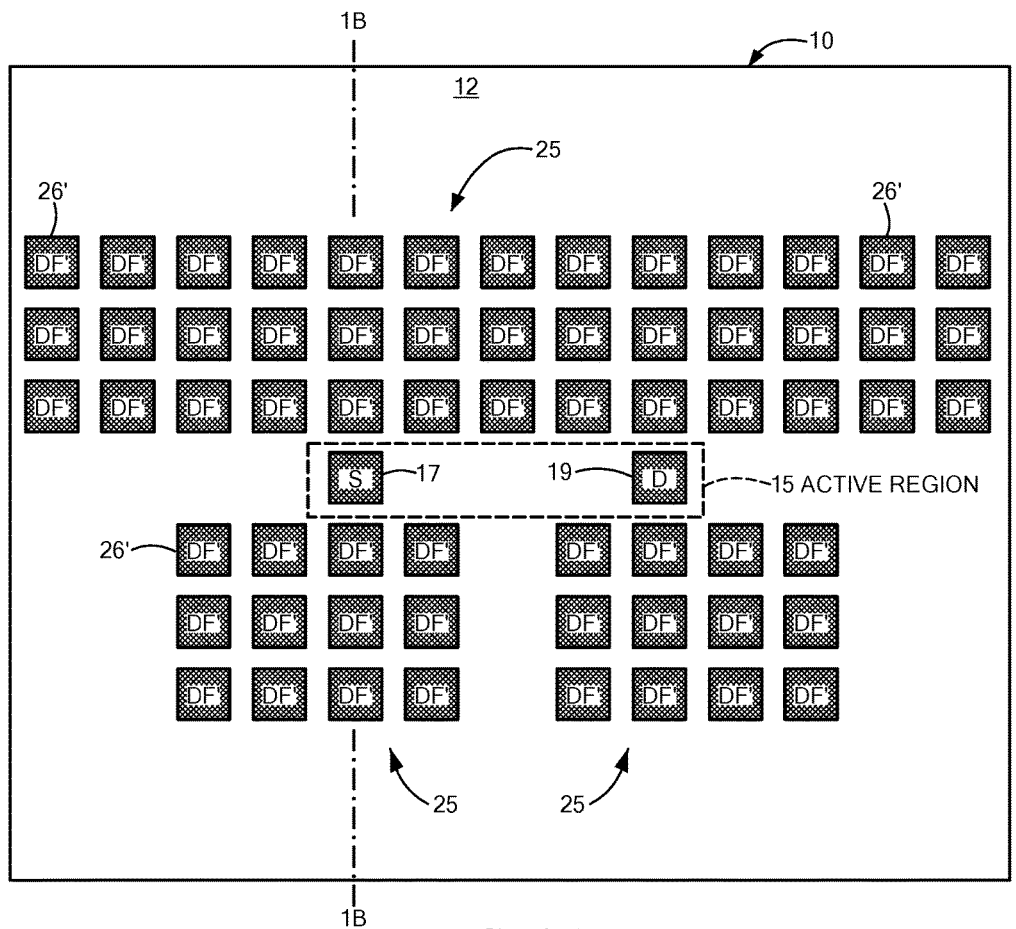
FIGS. 1A and 1B are top plan and cross sectional diagrammatical sketches, respectively, of a Monolithic Microwave Integrated Circuit (MMIC) structure substrate surface layout prior to Rapid Thermal Anneal (RTA) processing to forming ohmic contact between a semiconductor active device region of the substrate and materials used for source and drain contacts of a Field Effect Transistor (FET) active device, the substrate surface having "dummy" fill elements having substantially the same radiation reflectivity as the material used to form the ohmic contact with the semiconductor active device region according to the disclosure, the cross section of FIG. 1B being taken along line 1B-1B in FIG. 1A.
Figure 1B:
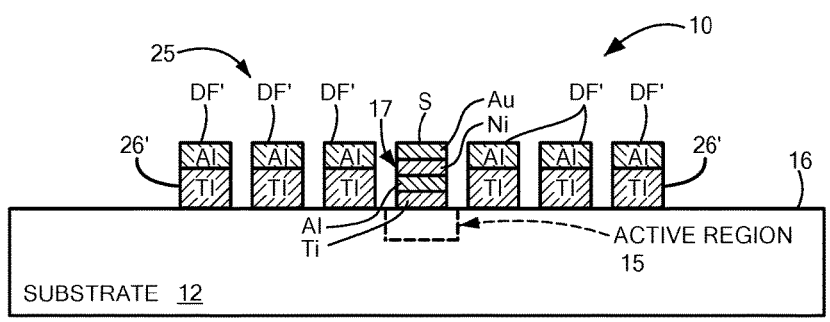

Referring now to FIGS. 1A and 1B, a Monolithic Microwave Integrated Circuit structure 10 is shown. The structure 10 includes a substrate 12, here for example, silicon carbide (SiC) having an active device region 15, here, for example an aluminum gallium nitride (AlGaN) region on a portion of an upper surface 16 of the substrate 12. The structure 10 includes, on the substrate 12, a source (S) contact material 17 and a drain (D) contact material 19, here for example, a Ti/Al/Ni/Au stack (a bottom layer of titanium, a layer of aluminum of the layer of titanium, a layer of nickel on the layer of aluminum, and a top layer of gold on the layer of nickel) disposed on the active region 15, as indicated. The substrate 12 also includes a plurality of "dummy" fill elements 26' (also indicated as DF'), here arranged, for example, in three arrays 25 outside of the active region 15, as shown. Here, for example, each one of the "dummy" fill elements 26' is here a stack of Ti/Al (a bottom layer of titanium and a top layer of aluminum), as indicated in FIG. 1B here disposed on the upper surface 16 of the substrate 12 and here, for example, displaced from the active device region 15. The "dummy" fill elements 26' are physically spaced, or islands, arranged on the upper surface 16 to locally tailor the radiant reflection and absorption properties of the substrate 12 in order to promote uniform heating of source (S) and drain (D) contact material 17, 19, respectively, during a rapid thermal anneal process (RTA) to be described in connection with RTA apparatus shown in FIG. 2; the RTA process being used to alloy the source and drain metal contact materials 17, 19 into the semiconductor active region 15, and hence form ohmic contacts for the source (S) and drain (D) electrodes, respectively, to the semiconductor material of the active device region 15; here, for example, an ohmic contact between the Ti (bottom layer of the Ti/Al/Ni/Au stacks 17, 19) and the AlGaN of the active device region 15.

Figure 2:
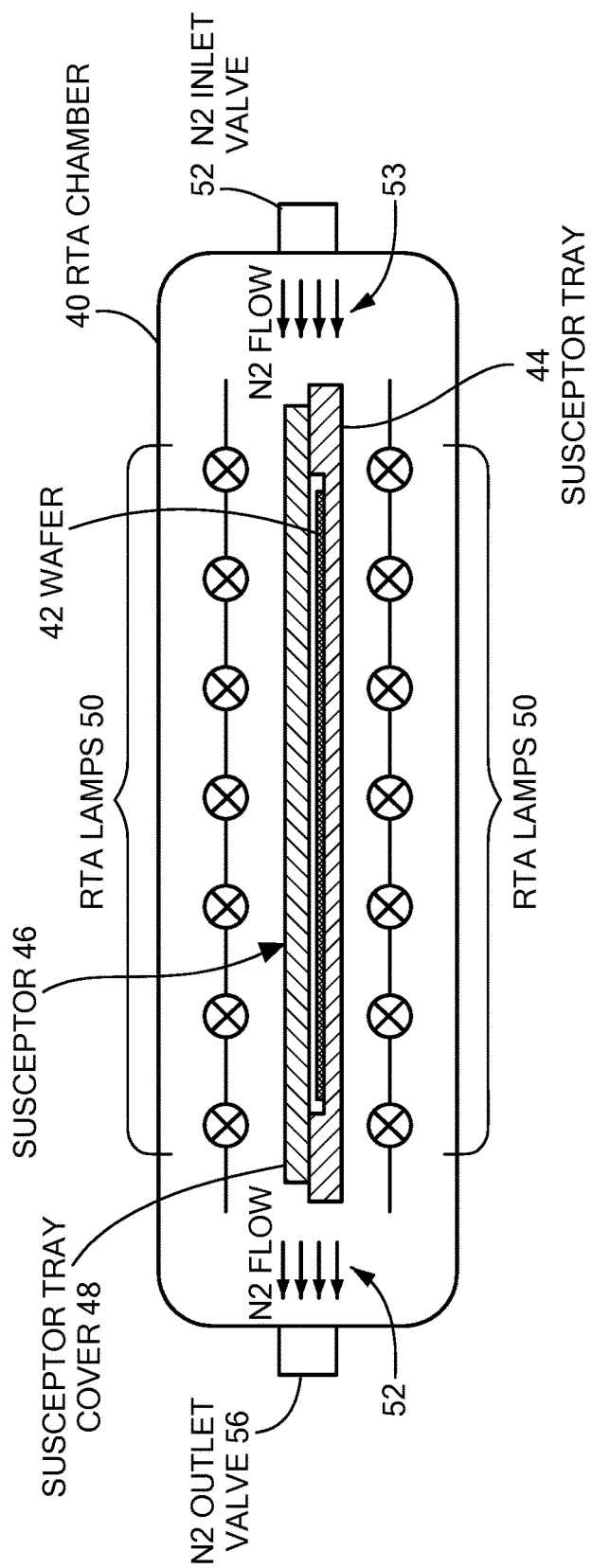
FIG. 2 is a diagrammatical sketch of a rapid thermal anneal (RTA) apparatus for processing a wafer having the Monolithic Microwave Integrated Circuit structure substrate of FIGS. 1A and 1B according to the disclosure.
Figure 3A:
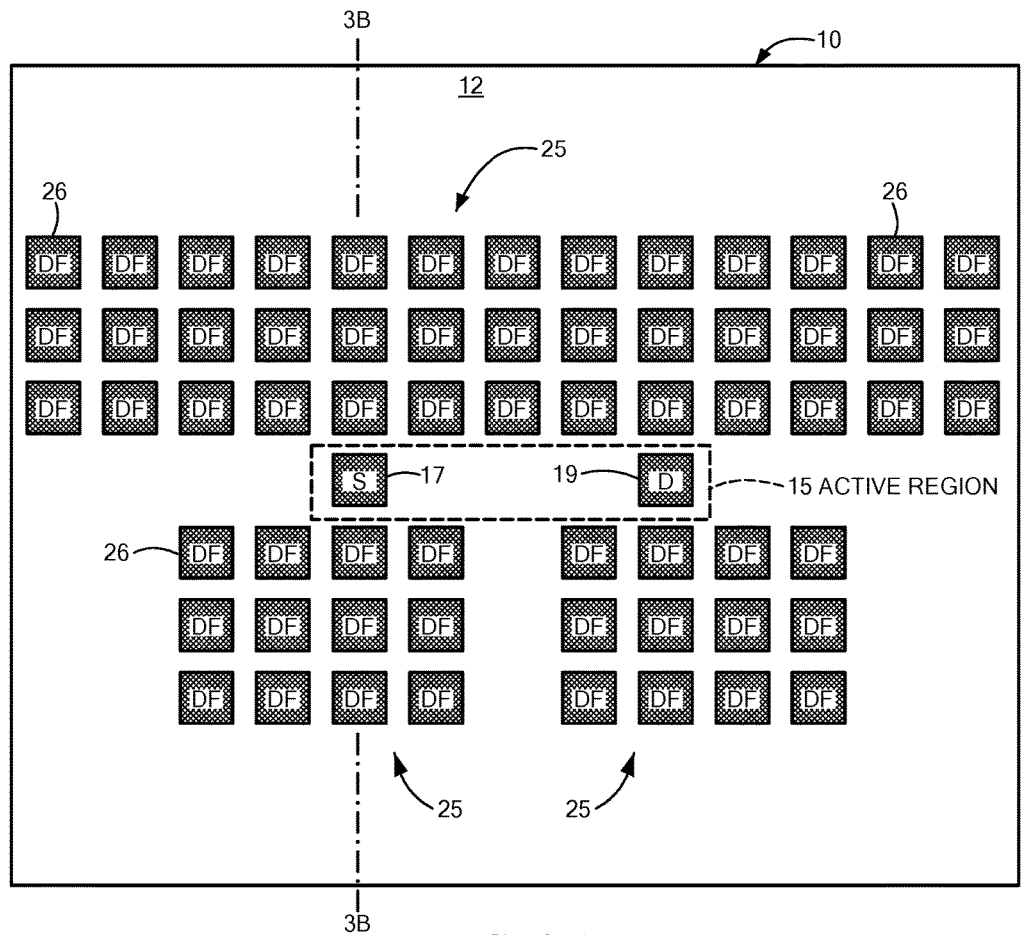
FIGS. 3A and 3B are top plan and cross sectional diagrammatical sketches, respectively, of the Monolithic Microwave Integrated Circuit (MMIC) structure substrate of FIGS. 1A and 1B subsequent to RTA apparatus of FIG. 2 forming ohmic contact between the semiconductor active device region of the substrate and the materials used for the source and drain contacts of the Field Effect Transistor (FET) active device according to the disclosure, the cross section of FIG. 1B being taken along line 3B-3B in FIG. 3A, the RTA processing having converted the "dummy" fill elements in FIGS. 3A and 3B into microwave lossy "dummy" fill elements according to the disclosure.
Figure 3B:
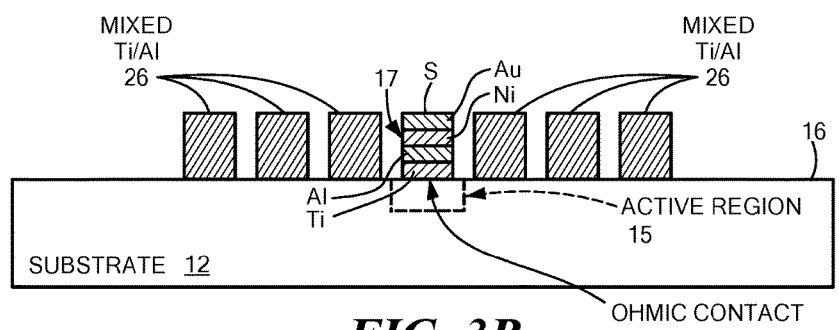

As will be described in connection with FIGS. 3A and 3B, the RTA process mixes the Ti/A materials of the "dummy" fill elements 26' (FIGS. 1A and 1B) with the result that the RTA anneal process creates post-RTA "dummy" fill elements 26 (FIGS. 3A and 3B) that are microwave lossy "dummy" fill elements 26 (FIGS. 3A and 3B). It is noted that material used for the dummy" fill elements 26' during the initial portion of the RTA process has a reflectively within ten percent of the reflectivity of the source (S) and drain (D) electrode material 17, 19 to the wavelength of the radiant energy of RTA halogen heating lamps. For example, source (S) and drain (D) electrode material 17, 19 having a reflectivity of 80% to the incident radiating energy from the RTA would require the "dummy" fill elements 26' to have reflectivity between 70% and 90%. The upper surface 16 of the substrate 12 will be subject to a RTA process to be described in connection with FIGS. 3A and 3B; suffice it to say here that the upper surface 16 of the substrate 12 will subjected to the source of radiant energy to be described in connection with FIG. 2 to simultaneously both: form an ohmic contact between the source (S) and drain (D) electrode material 17, 19 and the semiconductor material, here for example, AlGaN, used for the active device region 15; and, mix the Ti/Al materials of the "dummy" fill elements 26' (FIG. 1B) to thereby convert them into microwave lossy "dummy" fill elements 26 (FIGS. 3A and 3B). More particularly, here the "dummy" fill elements 26' includes a 500A thick layer of titanium and a 1500A thick layer of Aluminum, here heated at a temperature in the range 800° C. to 900° C. to produce a Ti/Al alloy having a resistivity of 9 ohms per square. Thus, while the titanium itself has a resistivity of 6 ohms per square and the aluminum itself has a resistivity of 220 milliohms per square, the titanium/aluminum alloy has a resistivity of 9 ohms per square. Titanium alone is lossy, but would provide a poor reflectivity match to the ohmic metals. Aluminum alone would provide a good reflectivity match, but the resistivity is so low that it is not effective in many applications as a microwave lossy material. The heated combination of these two elements to produce an alloy of aluminum and titanium is able to satisfy both criteria, and the resulting resistivity of the heated combined material is greater than the alloyed material individual constituents. It is noted that the resistivity is a function of the materials being alloyed and their thicknesses and the alloying temperature. It is also noted that the use of a microwave lossy material for the lossy "dummy" fill elements 26 reduces any undesired electromagnetic coupling between the strip conductors 28, 29, 31 (FIGS. 4A and 4B), to be described in connection with FIGS. 4A and 4B to the microwave lossy "dummy" fill elements 26 and also between the lossy "dummy" fill elements 26 themselves enabling the a microwave lossy "dummy" fill elements 26 to be placed closer to the strip conductors 28, 29, 31 thereby freeing up space for additional circuitry as indicated in FIGS. 5A and 5B, where the "dummy" 26' fill elements (DF') are the same material (Ti/Al/Ni/Au) as the source and drain ohmic contact material, as "available space" 30 in FIGS. 4A and 4B. Here, for example, as shown in FIG. 1B a titanium/aluminum metal stack is used, here for example, with thickness less than 2000 Å is used as the "dummy" fill elements 26' and has the substantially the same optical reflectivity and absorption compatible with the source (S) and drain (D) contacts of Ti/Al/Ni/Au. After the "dummy" fill elements 26' have been subjected to RTA processing and converted into the microwave lossy "dummy" fill elements 26, the microwave lossy "dummy" fill elements 26 will have an electrical impedance or resistance three orders of magnitude higher than that of the strip conductors 28, 29, 31 to be described in connection with FIGS. 4A and 4B, used in the microwave transmission lines 30, 32, respectively.

Further, the resistivity of lossy "dummy" fill elements 26 after RTA may be from 2 ohm/square and greater while strip conductors 28, 29, 31 used in the microwave transmission lines 30, 32, 36 to be described in connection with FIGS. 4A and 4B have a resistivity of few milli-ohm/square, depending on the thickness and material used for the strip conductors 28, 29, 31. In any event, the resistivity of lossy "dummy" fill elements 26 is at least two orders of magnitude greater than the resistivity of the strip conductors 28, 29, 31 of the microwave transmission lines 30, 32, 36.

Referring now to FIG. 2, a RTA chamber 40 is shown. A wafer 42 having the structure 10 (FIGS. 1A and 1B) with the MMIC described above in connection with FIGS. 1A and 1B is inserted onto a bottom tray 44 of a graphite susceptor 46. The lid or cover 48 of the graphite susceptor 46, also graphite is placed on the tray 44 over the wafer 42. The susceptor 46, with the enclosed wafer 42, is inserted into the chamber 40 between a pair of upper and lower halogen lamps 50, as shown. A flow of nitrogen, $N_2$, is passes through the chamber 40 over the inserted susceptor 46 between an inlet valve 52 and an outlet valve 56, as indicated by the arrows 53. Then lamps 50 are turned on. Radiant energy from the lamps 50 is absorbed by graphite susceptor 46. The graphite susceptor 46 heats from the absorbed radiate energy and the heat absorbed by the susceptor 46 heats the enclosed wafer 42 by both conduction and re-radiation. That is, the heated susceptor 46 acts as a black body to absorb the radiant energy and the re-radiates a portion of the absorbed energy as radiant energy on the upper surface 16 (FIG. 1B) of the wafer 42 to heat the wafer 42. The heated wafer 42 causes an alloying between the source (S) and drain (D) electrodes and the semiconductor material of the active device region 15 (FIGS. 1A and 1B) and simultaneously alloying the aluminum and titanium to convert the "dummy" fill elements to the microwave lossy dummy" fill elements 26.

Figure 4A:
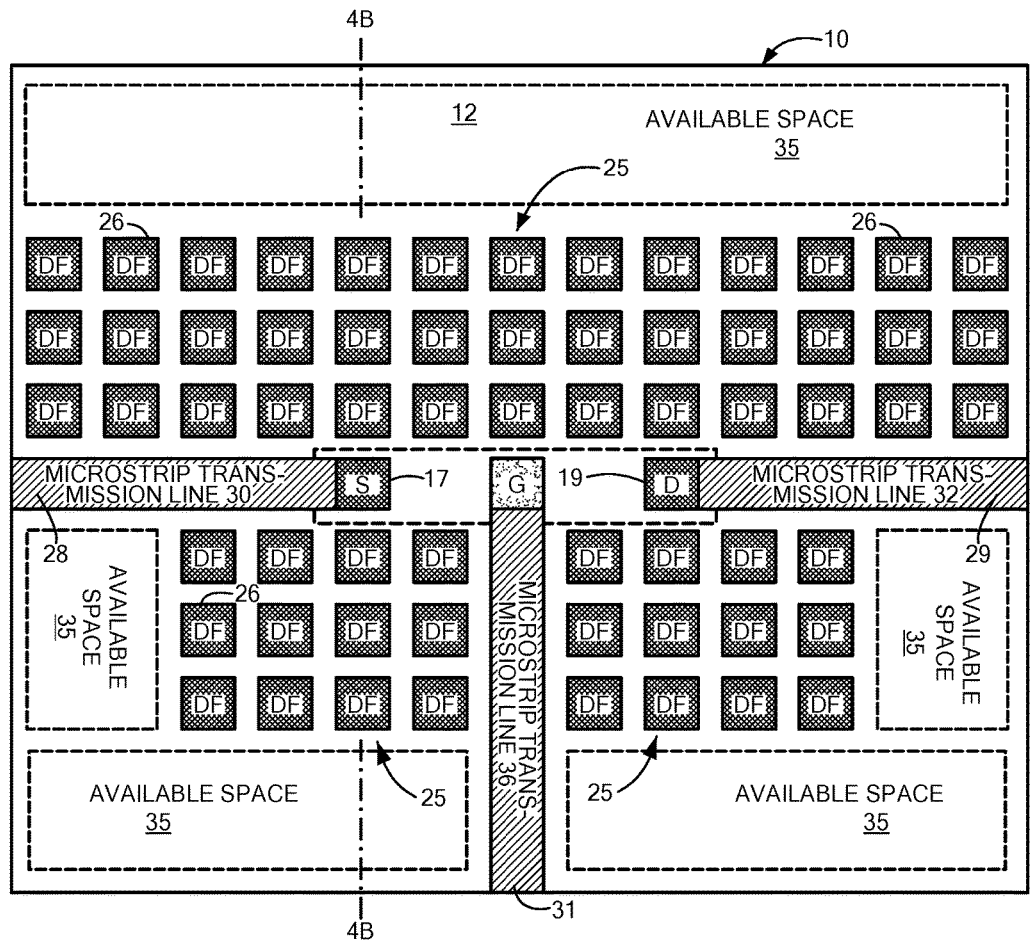
FIGS. 4A and 4B are top plan and cross sectional diagrammatical sketches, respectively, of the Monolithic Microwave Integrated Circuit (MMIC) structure substrate of FIGS. 3A and 3B after forming a gate Schottky contact to the semiconductor active device region of the substrate for the FET and after forming microwave transmission lines on the substrate connected to the source and drain ohmic contacts according to the disclosure.
Figure 4B:
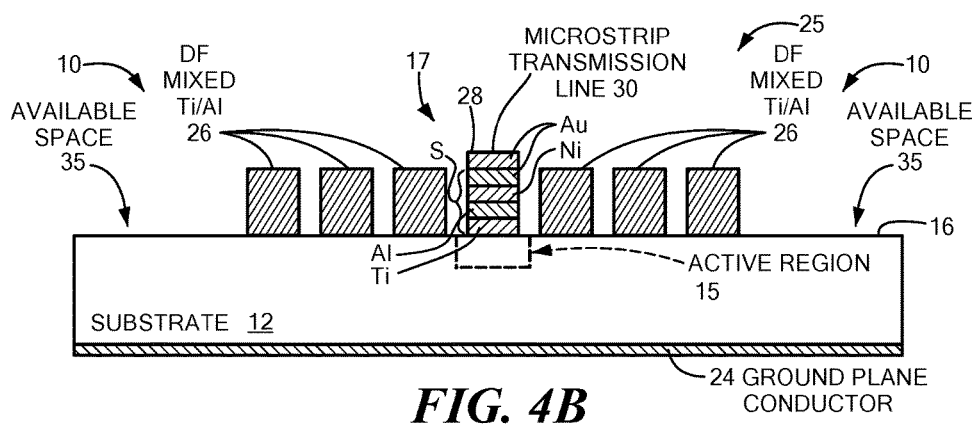
Figure 5A:
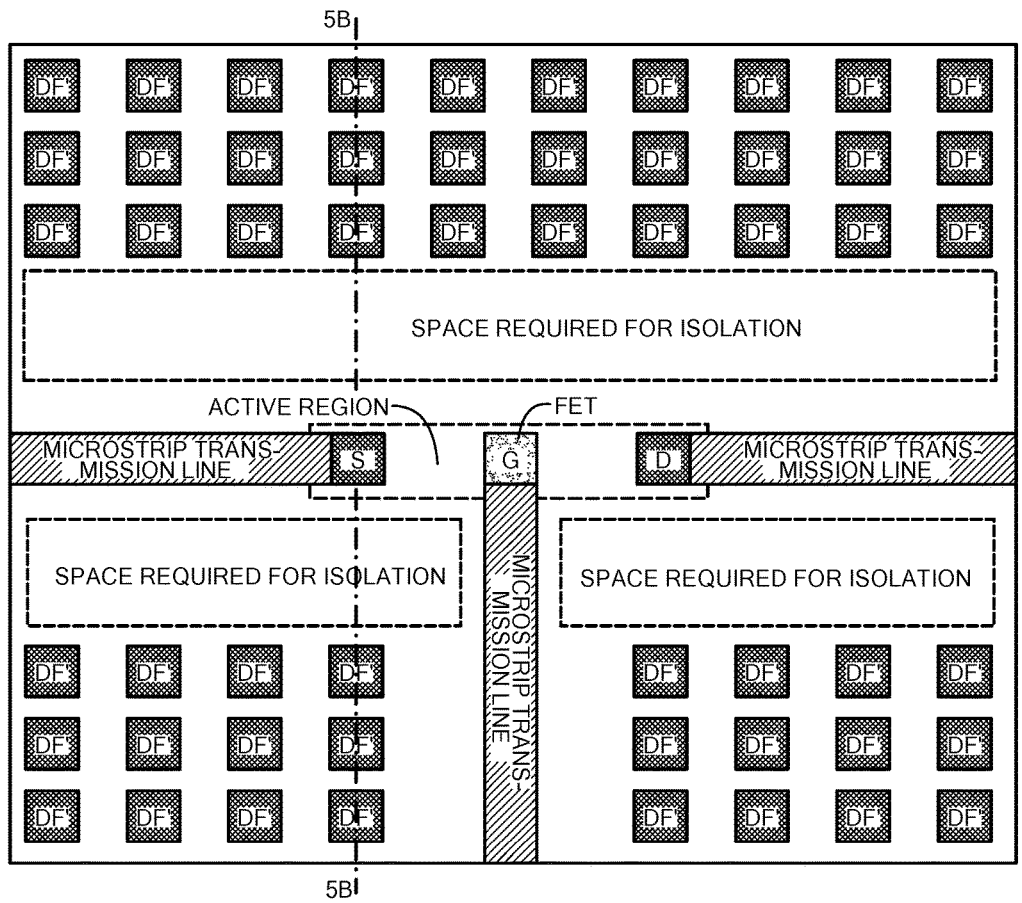
FIGS. 5A and 5B are top plan and cross sectional diagrammatical sketches, respectively, of a Monolithic Microwave Integrated Circuit having "dummy" fill elements of the same material as material used to form ohmic contacts with the semiconductor active device region, such sketches being used to compare the space saved on the surface the MMIC of FIGS. 4A and 4B, the cross section of FIG. 5B being taken along line 5B-5B in FIG. 5A.
Figure 5B:
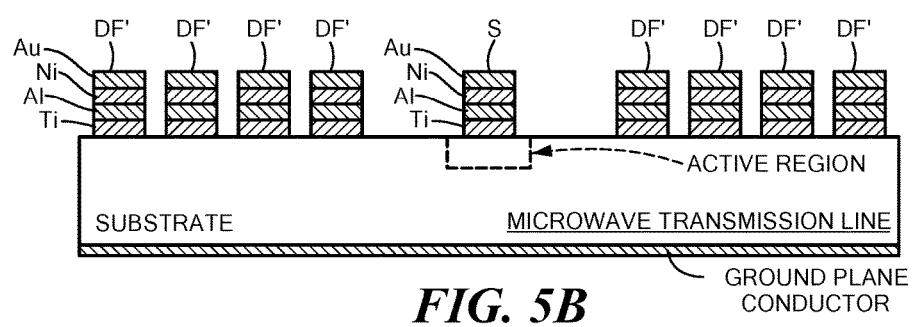

Referring now to FIGS. 4A and 4B, after removal of the wafer 4442 from the RTA chamber 40 (FIG. 2), a gate (G) electrode is formed in Schottky contact to the semiconductor active device region 15 of the substrate 12 for a FET 34 and microwave transmission lines 30, 32, 36 are formed on the substrate 12 connected to the source (S) and drain (D) ohmic contact materials 15, 17 (FIGS. 1A and 1B) and gate materials. Here, for example, the microwave transmission lines 30, 32, 36 are microstrip transmission lines having the strip conductors 28, 29, 31 formed on the upper surface 16 of the substrate 12 and a ground plane conductor 24 formed on the bottom surface of the substrate 12. As noted above, after the "dummy" fill elements 26' have been subjected to RTA processing and converted into the microwave lossy "dummy" fill elements 26, the microwave lossy "dummy" fill elements 26 having an electrical impedance or resistance three orders of magnitude higher than that of the strip conductors 28, 29, 31 used for the microwave transmission line 30, 32, 36. Further, as noted above, for the Ti/Al example described above, the resistivity of lossy "dummy" fill elements 26 after RTA is 9 ohm/square while the strip conductors 28, 29, 31 (FIGS. 4A and 4B) have a resistivity of few milliohms per square, depending on the thickness and material used for the strip conductors 28, 29, 31. In any event, the resistivity of lossy "dummy" fill elements 26 is at least two orders of magnitude greater than the resistivity of the strip conductors 28, 29, 31 of the microwave transmission lines 30, 32, 36.

As noted above, the use of a microwave lossy material for the microwave lossy "dummy" fill elements 26 reduces any undesired electromagnetic coupling between the strip conductors 28, 29, 31, to the microwave "dummy" fill elements 26, and between the microwave "dummy" fill elements 26 themselves (e.g., between adjacent microwave "dummy" fill elements 26) enabling the microwave lossy material for the microwave lossy "dummy" fill elements 26 to be placed closer to the adjacent microwave lossy "dummy" fill elements 26 and the strip conductors 28, 29, 31 freeing up space for additional circuitry as indicated in by comparing FIGS. 4A and 4B with FIGS. 5A with 5B. For example, using microwave lossy material for the "dummy" fill elements 26 in place of the same material used for the source (S) and drain (D) electrodes reduces the separation between the strip conductors 28, 29, 31 and the microwave lossy "dummy" fill elements 26. Thus, the microwave lossy metal "dummy" fill elements 26 are used to simultaneously solve the heating uniformity problem without inducing RF performance degradation in the circuit thereby enabling the area required for the "dummy" fill elements 26' to be closer to the microwave strip conductors 28, 29, 31 connected to the FET 34 (to be described in connection with FIGS. 4A and 4B) and freeing up additional surface area of the chip (upper surface 16 of the substrate 12 for additional circuitry. Thus, the disclosure provides on-wafer compensation elements ("dummy" fill elements) for improved heating uniformity during rapid thermal anneal (RTA) processing, with such ("dummy" fill elements having electrical properties that allow for improved compaction when integrated with radio frequency (RF) monolithic microwave integrated circuit (MMIC) technology.

Referring again to FIGS. 4A and 4B, a FET 15 includes a gate (G) in Schottky contact with the active device region 15 for controlling a flow of carriers passing through the active device region 15 between a source region in ohmic contact with a source electrode (S) and a drain region in ohmic contact with a drain electrode (D), as indicated.

The microwave transmission lines 30, 32, 36 here a microwave transmission line having strip conductors 28, 29, 31 here for example gold, separated from a ground plane conductor 24 (FIG. 4B), here also gold, by the substrate 12, as indicated, is provided after the RTA processing. Three strip conductors 28, 29, and 31 are respectively connected to the source (S), drain (D), and gate (G) electrodes, as shown.

Figure 6A:
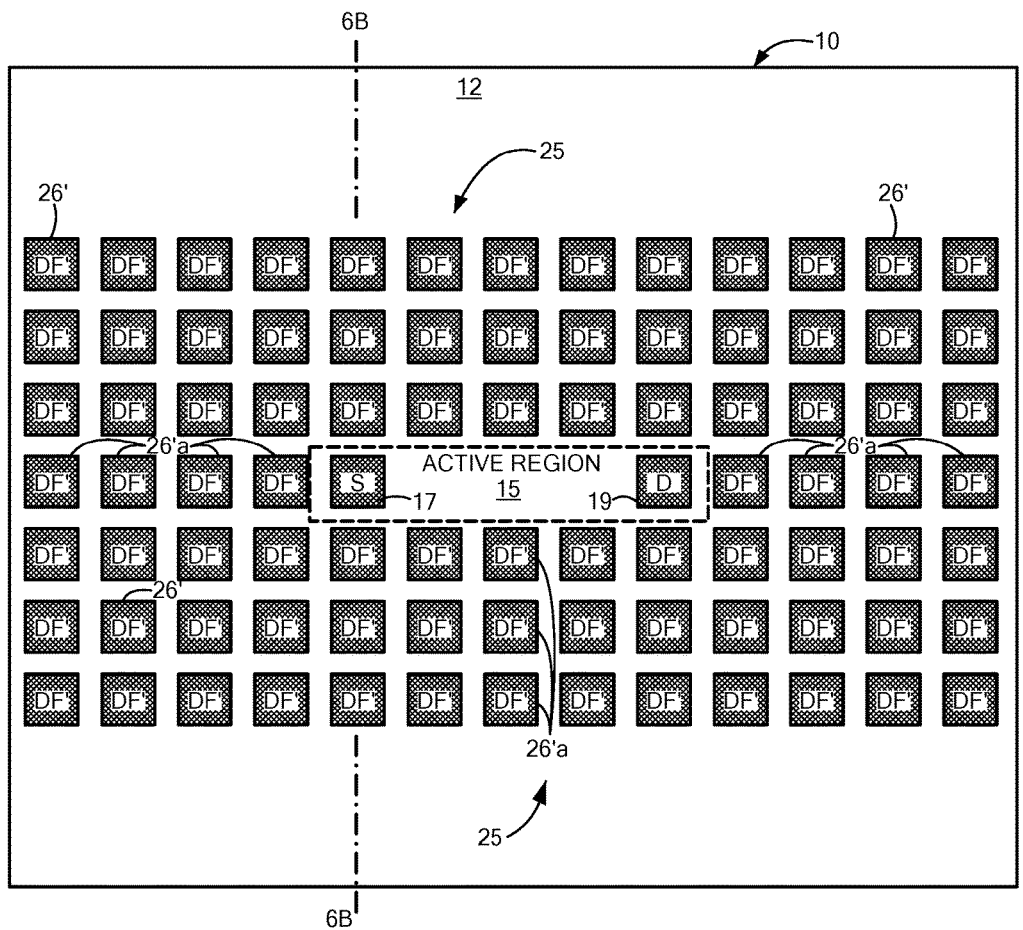
FIGS. 6A and 6B are top plan and cross sectional diagrammatical sketches, respectively, of a Monolithic Microwave Integrated Circuit (MMIC) structure substrate surface layout according an alternative embodiment of the disclosure prior to Rapid Thermal Anneal (RTA) processing to forming ohmic contact between a semiconductor active device region of the substrate and materials used for source and drain contacts of a Field Effect Transistor (FET) active device, the substrate surface having "dummy" fill elements having substantially the same radiation reflectivity as the material used to form the ohmic contact with the semiconductor active device region according to the disclosure, the cross section of FIG. 1B being taken along line 1B-1B in FIG. 1A, a portion of the "dummy" fill elements being positioned for disposition under microwave transmission lines to be connected to the source and drain contacts according the alternative embodiment.
Figure 6B:
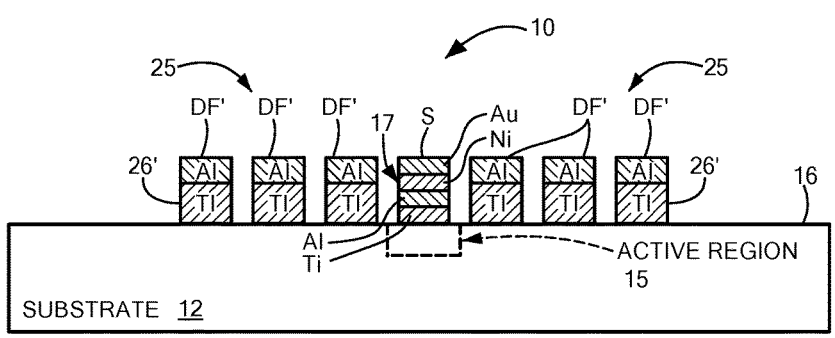

Referring now to FIGS. 6A and 6B, a Monolithic Microwave Integrated Circuit (MMIC) structure includes substrate 12 surface layout according an alternative embodiment of the disclosure prior to Rapid Thermal Anneal (RTA) processing to form ohmic contact between a semiconductor active device region 15 of the substrate 12 and materials 17, 19 used for source and drain contacts of a Field Effect Transistor (FET) active device 34. Here again, the substrate 12 upper surface 16 has "dummy" fill elements 26' having substantially the same radiation reflectivity as the material 17, 19 used to form the ohmic contact with the semiconductor active device region 15. Here, however, a portion of the "dummy" fill elements 26', here indicated "dummy" fill elements 26'*a* are positioned for disposition under the strip conductors 28, 29, 31 to be connected to the source and drain contact materials 17, 19 and the gate electrode, G, respectively.

Figure 7A:
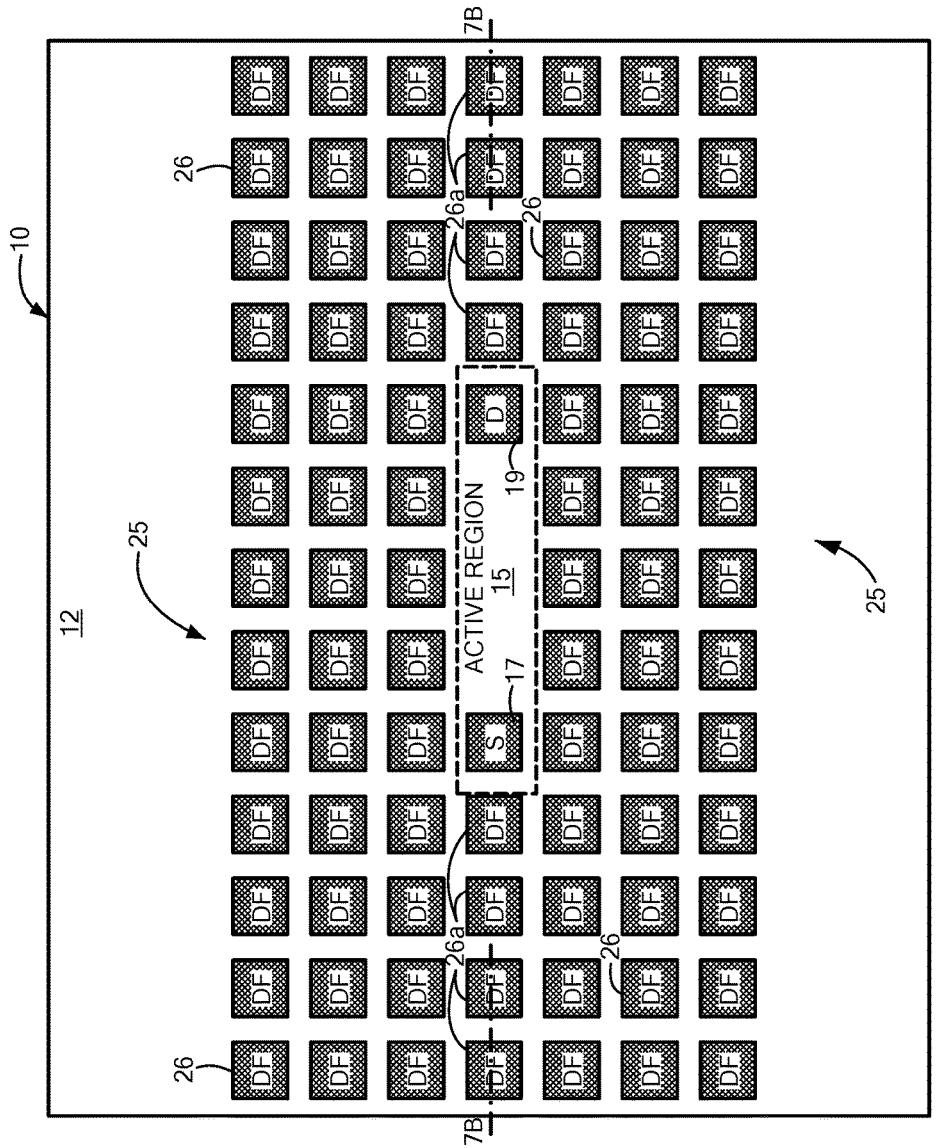
FIGS. 7A and 7B are top plan and cross sectional diagrammatical sketches, respectively, of the Monolithic Microwave Integrated Circuit (MMIC) structure substrate of FIGS. 6A and 6B subsequent to RTA apparatus of FIG. 2 forming ohmic contact between the semiconductor active device region of the substrate and the materials used for the source and drain contacts of the Field Effect Transistor (FET) active device according to the alternative embodiment of the disclosure.
Figure 7B:
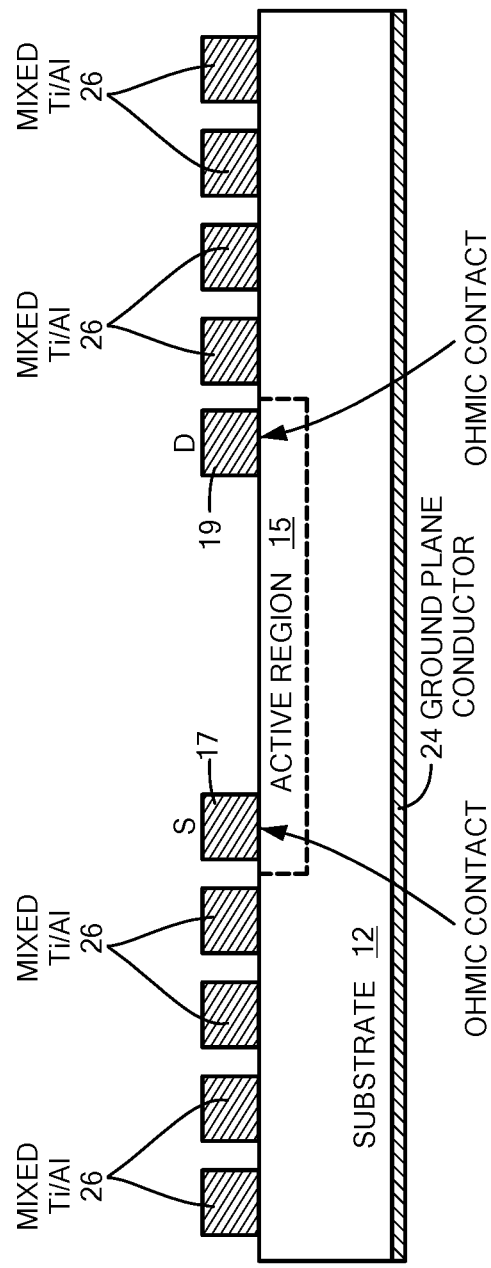

Referring now to FIGS. 7A and 7B, the Monolithic Microwave Integrated Circuit (MMIC) structure substrate 12 of FIGS. 6A and 6B is shown subsequent to RTA apparatus of FIG. 2 forming ohmic contact between the semiconductor active device region 15 of the substrate and the materials 17, 19 used for the source and drain contacts of the Field Effect Transistor (FET) active device 34.

Figure 8A:
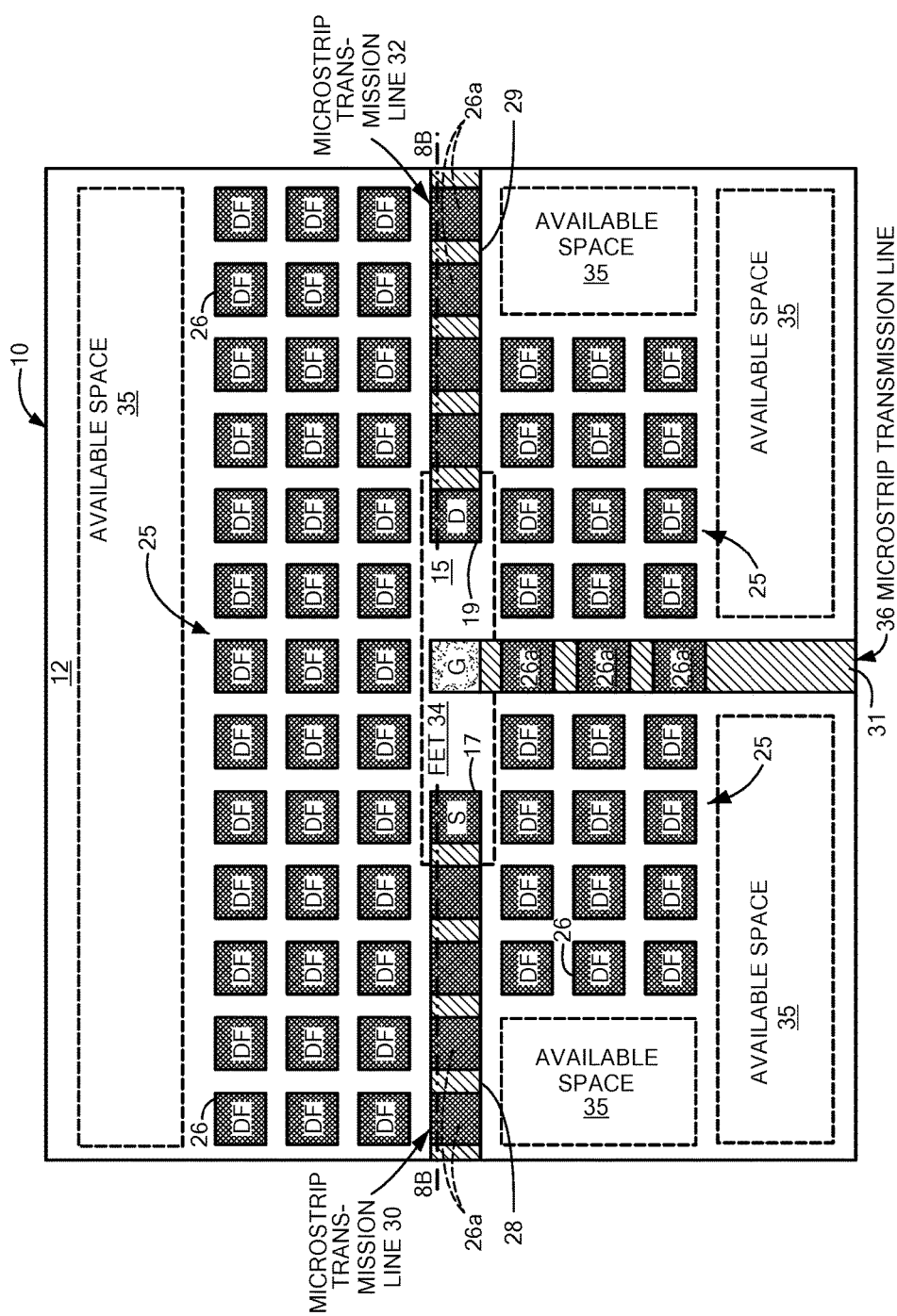
FIGS. 8A and 8B are top plan and cross sectional diagrammatical sketches, respectively, of the Monolithic Microwave Integrated Circuit (MMIC) structure substrate of FIGS. 7A and 7B after forming a gate Schottky contact to the semiconductor active device region of the substrate for the FET and after forming microwave transmission lines on the substrate connected to the source and drain ohmic contacts according to the alternative embodiment of the disclosure.
Figure 8B:
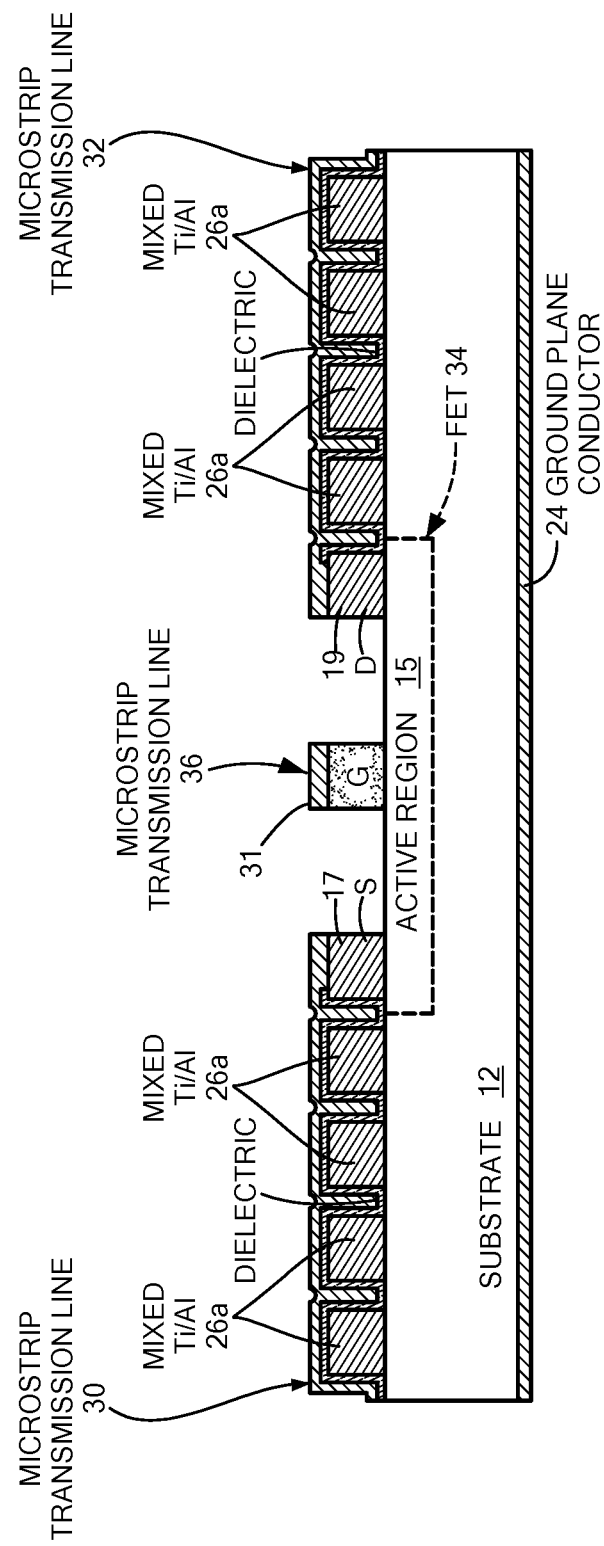

Referring now to FIGS. 8A and 8B, the Monolithic Microwave Integrated Circuit (MMIC) structure substrate 12 of FIGS. 7A and 7B is shown after forming a gate (G) Schottky contact to the semiconductor active device region 15 of the substrate 12 for the FET 34 and after forming microwave transmission line strip conductors 28, 29, 31 connected to the source and drain ohmic contact materials 17, 19 and gate electrode G, respectively. It is noted that the strip conductors 28, 29, 31 are separated from the "dummy" fill elements 26*a* by a dielectric layer 37, such as, for example, silicon dioxide, except where the strip conductors 28, 29, 31 make electrical contact to the tops of the source (S) and drain (D) contact materials 17, 19 and gate electrode C, respectively, as indicated in FIG. 8B.

Figure 9:
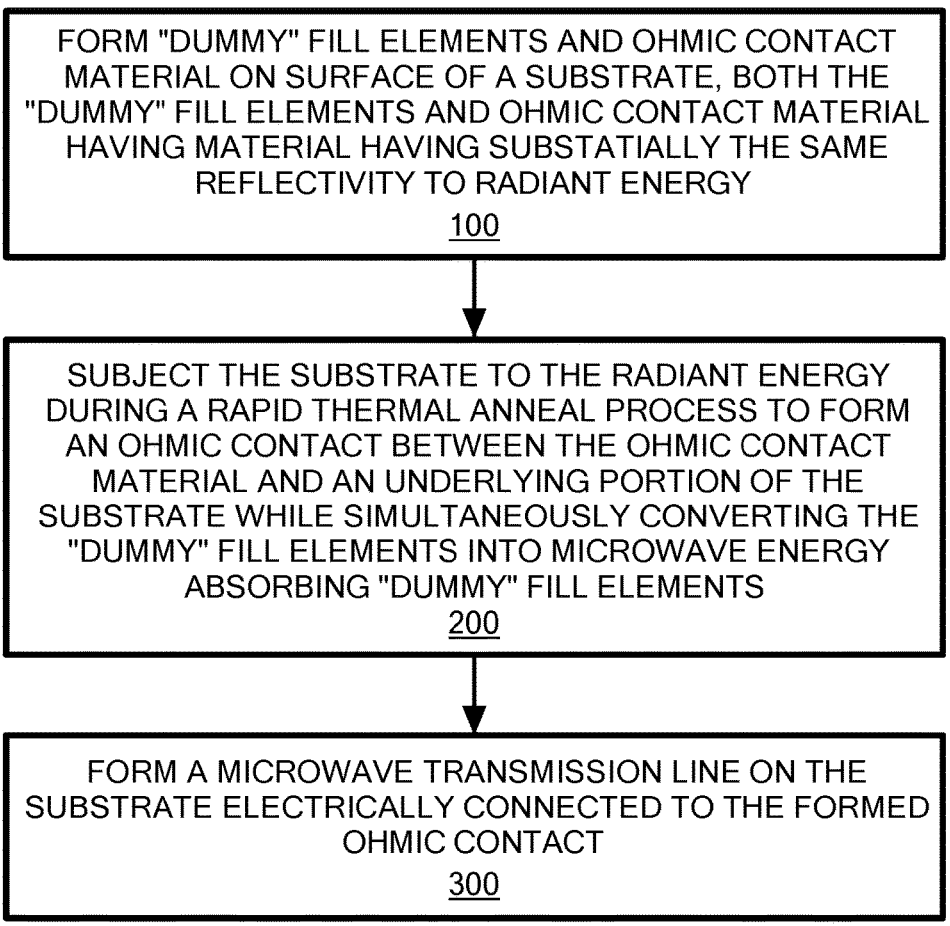
FIG. 9 is a flow diagram of a process used to form the MMICs of FIGS. 5A and 5B and FIGS. 8A and 8B in accordance with the disclosure.

Referring now to FIG. 9 is a flow diagram of a process used to form the MMICs of FIGS. 1A, 1B, 2, 3A, 3B, 4A, 4B and FIGS. 6A, 6B, 7A, 7B, 8A, 8B in accordance with the disclosure is shown. The process includes: forming "dummy" fill elements 26' and ohmic contact material 17, 19 on surface 16 of a substrate 12, both the "dummy" fill elements 26' and ohmic contact material 17, 19 having substantially the same reflectivity to radiant energy (STEP 100); subjecting the substrate 12 to the radiant energy during a rapid thermal anneal process to form an ohmic contact (S), (D) between the ohmic contact material 17, 19 and an underlying portion of the substrate 12 while simultaneously converting the "dummy" fill elements 26' into microwave energy absorbing "dummy" fill elements 26 (STEP 200); and forming a microwave transmission line 28, 29 on the substrate electrically connected to the formed ohmic contact (S), (D)(STEP 300).

A number of embodiments of the disclosure have been described. Nevertheless, it will be understood that various modifications may be made without departing from the spirit and scope of the disclosure. For example, with a stack of Ta/Al/Ta for the source and drain contact material, the "dummy" fill elements that would satisfy both the microwave lossy criteria and reflectivity matching criteria may be a thin layer of tantalum or tantalum nitride. In such an example, the resistivity of the 'dummy fill' can be tailored by its thickness in the case of a pure tantalum thin film, or through the controlled incorporation of nitrogen into the tantalum film during deposition to form a highly resistive tantalum nitride. Further, the semiconductor material for the active device region 15 may be semiconductor material other than AlGaN such as GaN, silicon carbide, diamond, zinc oxide, or Group III-V material, for example Further, other types of microwave transmission lines may be used, for example coplanar waveguide (CPW) or stripline transmission lines. Still further, while a portion of the "dummy" fill elements may be formed under the strip conductor of a passive component such as the strip conductor of a microwave transmission line as described above, a portion of the "dummy" fill elements may be formed under other passive components, such as a capacitor or inductor by either separating them with a dielectric layer 37 as shown in FIG. 8A or without a such a dielectric layer 37 because the "dummy" fill elements 26' have been converted into a lossy material. Accordingly, other embodiments are within the scope of the following claims.

What is claimed is:

1. A structure, comprising:
   a substrate;
   an active device in an active device semiconductor region of the substrate;
   a microwave transmission line, on the substrate, having an electrical conductor electrically connected to the active device; and
   a plurality of microwave energy absorbing "dummy" fill elements on the substrate.

2. The structure recited in claim 1 wherein the microwave energy absorbing "dummy" fill elements have a resistivity at least an order of magnitude greater than the resistivity of the electrical conductor.

3. The structure recited in claim 1 wherein the microwave energy absorbing "dummy" fill elements and a strip conductor of the microwave transmission line are on a surface of the substrate.

4. The structure recited in claim 1 wherein a portion of the microwave energy absorbing "dummy" fill elements are disposed under a passive component.

5. The structure recited in claim 4 wherein the passive component is a strip conductor of the microwave transmission line.

6. A method for forming ohmic contacts, comprising:
   providing a structure comprising: a substrate; an active device region of a portion of a surface of the substrate; an ohmic contact material on the active device region; and a plurality of "dummy" fill elements on the surface of the substrate to provide uniform heating of the substrate during a anneal processing of the substrate; and
   subjecting the surface of the substrate to the anneal processing from a source of the radiant energy to form an ohmic contact between an ohmic contact material and the active device region and simultaneously convert the plurality of "dummy" fill elements into microwave lossy "dummy" fill elements.

7. The method recited in claim 6 wherein the plurality of"dummy" fill provide uniform heating of the substrate during the anneal processing of the substrate.

8. The method recited in claim 7 wherein the plurality of dummy" fill elements have a resistivity at least an order of magnitude greater than the resistivity of the ohmic contact material after the anneal processing.

9. The method recited in claim 5 wherein the provided electrically isolated dummy" fill elements have a reflectivity to radiant energy within ten percent of the reflectivity of electrical contacts of ohmic contact material prior to the anneal processing.

10. The structure recited in claim 1 wherein the plurality of dummy" fill elements have a resistivity at least an order of magnitude greater than the resistivity of the electrical strip conductors.

11. The structure recited in claim 1 wherein the plurality of microwave energy absorbing "dummy" fill elements are disposed along length of the a microwave transmission line.

12. The structure recited in claim 11 wherein the plurality of microwave energy absorbing "dummy" fill element reduce undesired electromagnetic coupling between the strip conductors to the microwave "dummy" fill elements and between the microwave "dummy" fill elements themselves.

13. A structure, comprising:
   a substrate;
   an active device in an active device semiconductor region of the substrate;
   a plurality of microwave transmission line, on the substrate, having electrical strip conductors electrically connected to the active device; and
   a plurality of microwave energy absorbing "dummy" fill elements on the substrate; and
   wherein the plurality of microwave energy absorbing "dummy" fill element reduce undesired electromagnetic coupling between the strip conductors to the microwave "dummy" fill elements and between the microwave "dummy" fill elements themselves.

14. The structure recited in claim 13 wherein the plurality of dummy" fill elements have a resistivity at least an order of magnitude greater than the resistivity of the electrical strip conductors.

* * * * *